United States Patent
Gao et al.

(10) Patent No.: US 10,204,758 B1
(45) Date of Patent: Feb. 12, 2019

(54) POSITIVE AND NEGATIVE ION SOURCE BASED ON RADIO-FREQUENCY INDUCTIVELY COUPLED DISCHARGE

(71) Applicant: Dalian University of Technology, Dalian, Liaoning Province (CN)

(72) Inventors: Fei Gao, Dalian (CN); Younian Wang, Dalian (CN)

(73) Assignee: DALIAN UNIVERSITY OF TECHNOLOGY, Dalian, Liaoning Province (CN)

( * ) Notice: Subject to any disclaimer, the term of this patent is extended or adjusted under 35 U.S.C. 154(b) by 0 days.

(21) Appl. No.: 15/725,045

(22) Filed: Oct. 4, 2017

(30) Foreign Application Priority Data

Aug. 11, 2017 (CN) .......................... 2017 1 0687473

(51) Int. Cl.
| | |
|---|---|
| H01J 27/00 | (2006.01) |
| H01J 49/10 | (2006.01) |
| H01J 27/20 | (2006.01) |
| H01J 37/08 | (2006.01) |
| H01J 37/24 | (2006.01) |
| H01J 37/05 | (2006.01) |
| H01J 37/32 | (2006.01) |

(52) U.S. Cl.
CPC ............ *H01J 27/205* (2013.01); *H01J 37/05* (2013.01); *H01J 37/08* (2013.01); *H01J 37/24* (2013.01); *H01J 37/321* (2013.01); *H01J 2237/082* (2013.01)

(58) Field of Classification Search
CPC ................ H01J 37/321; H01J 29/0095; H05H 2001/4652; H05H 2001/4667
See application file for complete search history.

(56) References Cited

U.S. PATENT DOCUMENTS

| | | | | |
|---|---|---|---|---|
| 5,962,345 | A * | 10/1999 | Yen ................... | H01L 21/02063 257/E21.577 |
| 2004/0104683 | A1* | 6/2004 | Leung ..................... | H01J 27/18 315/111.81 |
| 2010/0181474 | A1* | 7/2010 | Wang .................. | H01J 49/0095 250/282 |

* cited by examiner

Primary Examiner — Eliza Osenbaugh-Stewart
(74) Attorney, Agent, or Firm — Birch, Stewart, Kolasch & Birch, LLP

(57) ABSTRACT

The present invention discloses a positive and negative ion source based on radio-frequency inductively coupled discharge, comprising a tube, a middle portion of which is communicated with an intake pipe; discharge coils electrically connected to a matched network and a radio-frequency power supply successively are wound on the tube; one end of the tube is connected to a first cover plate in a sealed manner, and the first cover plate is connected with a positive ion extraction gate via an insulating medium; the positive ion extraction gate is electrically connected to a negative pole of a DC power supply; the other end of the tube is connected to a second cover plate in a sealed manner, the second cover plate is connected to a third cover plate in a sealed manner via a sidewall, and the third cover plate is connected with a negative ion extraction gate via an insulating medium; and the negative ion extraction gate is electrically connected to a positive pole of the DC power supply. In the present invention, the positive ions and the electrons and negative ions can be extracted simultaneously, and the problems of contamination of the ion source by particles sputtered from the backplane and overheating of the backplane are thus solved.

10 Claims, 1 Drawing Sheet

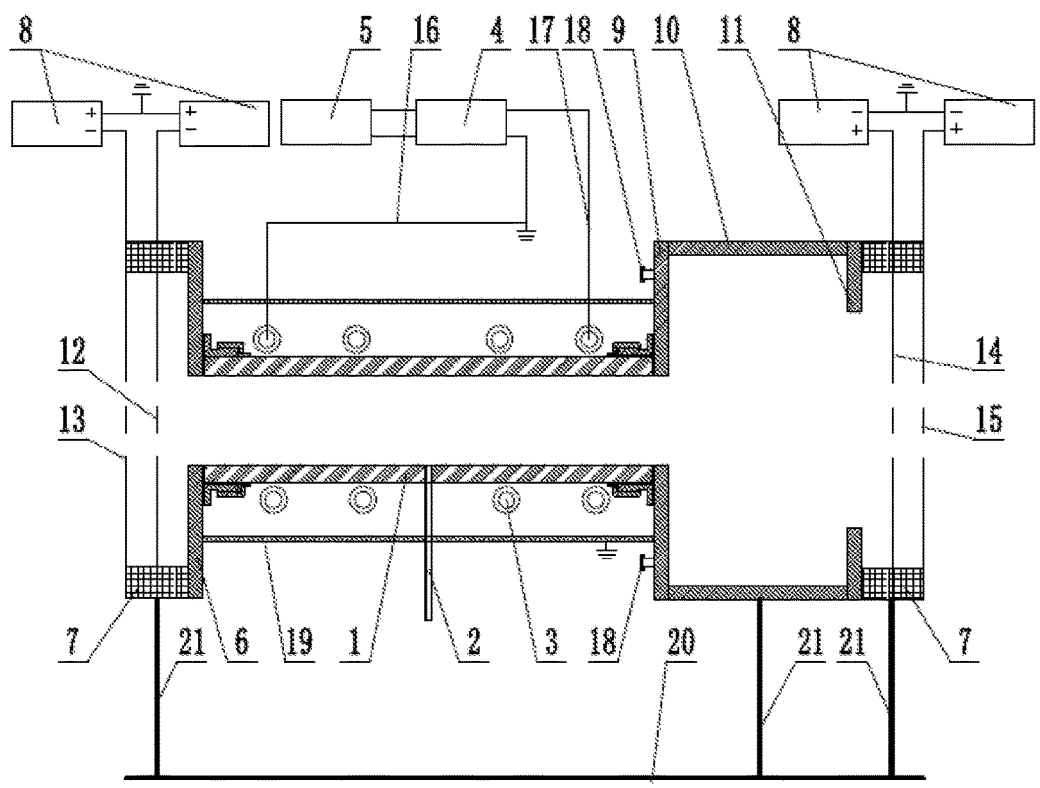

POSITIVE AND NEGATIVE ION SOURCE BASED ON RADIO-FREQUENCY INDUCTIVELY COUPLED DISCHARGE

This application claims priority to Chinese application number 201710687473.7, filed Aug. 11, 2017, with a title of POSITIVE AND NEGATIVE ION SOURCE BASED ON RADIO-FREQUENCY INDUCTIVELY COUPLED DISCHARGE. The above-mentioned patent application is incorporated herein by reference in its entirety.

TECHNICAL FIELD

The present invention relates to the technical field of an ion source generation apparatus and in particular to a positive and negative ion source based on radio-frequency inductively coupled discharge.

BACKGROUND

The ion source has been widely applied in aspects such as injection into solid surfaces, micro-machining, material surface modification and neutral beam injection, and has become an indispensable apparatus in many basic research fields, for example, studies of atomic physics, plasma chemistry, nuclear physics, material modification, etc. Ion beams extracted from the ion source have become an indispensable machining process and manufacturing approach in fields such as high-energy physics, microelectronics, photoelectronics, metallurgy, aerospace, medical instruments, mechanical manufacturing and heating for nuclear fusion.

For a conventional ion source generation apparatus, during the extraction from a pure positive ion source or a pure negative ion source, backstreaming of charged particles occurs. The backstreaming of the charged particles will result in sputtering or overheating of the backplane opposite to the extraction gate in the plasma generation region. For example, when a negative DC voltage is applied to the positive ion source extraction gate, the positive ions are extracted while the electrons and negative ions are repelled; and the electrons and negative ions are accelerated to high energy where they pass through the plasma generation region and hit onto the backplane to result in overheating and sputtering of the backplane. Similarly, when a positive DC voltage is applied to the negative ion source extraction gate, the negative ions and electrons are extracted while positive ions are repelled; and the positive ions are accelerated to high energy where they pass through the plasma generation region and hit onto the backplane to result in sputtering and overheating of the backplane. The backplane suffering from long-term sputtering and overheating will have greatly decreased service life, and particles sputtered from the backplane will contaminate the plasma or even the ion source.

SUMMARY

An objective of the present invention is to provide a positive and negative ion source based on radio-frequency inductively coupled discharge to solve the problems in the prior art so that the positive ions and the electrons and negative ions can be extracted simultaneously, and the problems of contamination of the ion source by particles sputtered from the backplane and overheating of the backplane are thus solved.

For this purpose, the present invention provides the following technical solutions.

The present invention provides a positive and negative ion source based on radio-frequency inductively coupled discharge, including a tube, a middle portion of which is communicated with an intake pipe; discharge coils electrically connected to a matched network and a radio-frequency power supply successively are wound on the tube; one end of the tube is connected to a first cover plate in a sealed manner, and the first cover plate is connected with a positive ion extraction gate via an insulating medium; the positive ion extraction gate is electrically connected to a negative pole of a DC power supply; the other end of the tube is connected to a second cover plate in a sealed manner, the second cover plate is connected to a third cover plate in a sealed manner via a sidewall, and the third cover plate is connected with a negative ion extraction gate via an insulating medium; and the negative ion extraction gate is electrically connected to a positive pole of the DC power supply.

Preferably, the positive ion extraction gate includes a first positive ion extraction gate and a second positive ion extraction gate which are successively arranged from inside out, the first positive ion extraction gate and the second positive ion extraction gate are each electrically connected to a negative pole of a DC power supply, and a negative voltage at the second positive ion extraction gate is higher than a negative voltage at the first positive ion extraction gate.

Preferably, a positive pole of the DC power supply to which the first positive ion extraction gate and the second positive ion extraction gate are electrically connected is grounded.

Preferably, the negative ion extraction gate includes a first negative ion extraction gate and a second negative ion extraction gate which are successively arranged from inside out, the first negative ion extraction gate and the second negative ion extraction gate are each electrically connected to a positive pole of a DC power supply, and a positive voltage at the second negative ion extraction gate is higher than a positive voltage at the first negative ion extraction gate.

Preferably, a negative pole of the DC power supply to which the first negative ion extraction gate and the second negative ion extraction gate are electrically connected is grounded.

Preferably, the matched network is electrically connected to one end of the discharge coils via a first coaxial transmission line whose middle portion is grounded, and the matched network is electrically connected to the other end of the discharge coils via a second coaxial transmission line.

Preferably, a flange joint for connecting a vacuometer and/or a detection system is provided on the second cover plate.

Preferably, a shield, which is grounded, is sleeved on an outer side of the discharge coils.

Preferably, the positive and negative ion source further includes a support platform and a support frame, the support platform being connected to the insulating medium and the sidewall via the support frame.

Preferably, the positive and negative ion source further includes vacuum systems, the first cover plate and the third cover plate being each communicated with one vacuum system.

Compared with the prior art, the present invention has the following technical effects.

The radio-frequency power supply outputs a radio-frequency power which is input to the discharge coils via the matched network. The radio-frequency power generates an electromagnetic field by the discharge coils, and the electromagnetic field ionizes the working gas in the tube to generate the plasma. After the generation of the plasma, a negative DC voltage is applied to the positive ion extraction gate on the positive ion extraction side to extract positive ion beams; and a positive DC voltage is applied to the negative ion extraction gate on the negative ion extraction side to extract the electrons or negative ion beams. When the electrons or negative ion beams move to between the second cover plate and the third cover plate from the tube, the energy of the high-energy electrons is decreased due to a certain distance of transport, and thus more low-energy electrons are formed and adsorbed by electronegative or electroneutral atoms or molecules to generate more negative ions. In this way, high-density negative ions are generated, which is more convenient for ion extraction. In the present invention, the positive ions and the electrons and negative ions are extracted from two sides of the tube, respectively; the backplane is omitted, so that the problems of sputtering and overheating of the backplane during the extraction of pure positive ions and pure negative ions are solved, and meanwhile, the ion source constituted by the positive ions and the electrons and negative ions will not be contaminated by the sputtering.

BRIEF DESCRIPTION OF THE DRAWING

To describe the technical solutions in the embodiments of the present invention or in the prior art more clearly, the accompanying drawings to be used in the description of the embodiments will be briefly described below. Apparently, the drawings described hereinafter are some of the embodiments of the present invention, and a person of ordinary skill in the art can obtain other drawings according to these drawings without paying any creative effort.

FIG. 1 is a structural diagram of a positive and negative ion source based on radio-frequency inductively coupled discharge according to the present invention, in which:
1: tube;
2: intake pipe;
3: discharge coil;
4: matched network;
5: radio-frequency power supply;
6: first cover plate;
7: insulating medium;
8: DC power supply;
9: second cover plate;
10: sidewall;
11: third cover plate;
12: first positive ion extraction gate;
13: second positive ion extraction gate;
14: first negative ion extraction gate;
15: second ion extraction gate;
16: first coaxial transmission line;
17: second coaxial transmission line;
18: flange joint;
19: shield;
20 support platform;
21: support frame.

DETAILED DESCRIPTION

The technical solutions in the embodiments of the present invention will be clearly and completely described below with reference to the accompanying drawings in the embodiments of the present invention. Apparently, the embodiments described herein are merely a part but not all of the embodiments of the present invention. All other embodiments obtained by a person of ordinary skill in the art without any creative effort on the basis of the embodiments in the present invention shall fall into the protection scope of the present invention.

An objective of the present invention is to provide a positive and negative ion source based on radio-frequency inductively coupled discharge to solve the problems in the prior art so that the positive ions and the electrons and negative ions can be extracted simultaneously, and the problems of contamination of the ion source by particles sputtered from the backplane and overheating of the backplane are thus solved.

To make the objectives, features and advantages of the present invention more obvious and comprehensible, the present invention will be further described below in detail by specific implementations with reference to the accompanying drawings.

As shown in FIG. 1, this embodiment provides a positive and negative ion source based on radio-frequency inductively coupled discharge, including a tube 1. The tube 1 is preferably made of quartz. A middle portion of the tube 1 is communicated with an intake pipe 2. Discharge coils 3 are wounded on the tube 1. The discharge coils 3 are generally wounded on the tube 1 by a copper tube. There is at least 1 turn, preferably 5-10 turns, of discharge coils 3. A cooling liquid may be fed into the copper tube for cooling. A shield 19 is sleeved on an outer side of the discharge coils 3. The shield 19 is required to be grounded. The shield 19 is preferably made of Al. The discharge coils 3 are electrically connected to a matched network 4 and a radio-frequency power supply 5 successively. An input end of the matched network 4 is electrically connected to an output end of the radio-frequency power supply 5 via a first coaxial transmission line 16, and an output end of the matched network 4 is electrically connected to an end of the discharge coils 3. A middle portion of the first coaxial transmission line 16 is grounded. The output end of the matched network 4 is also electrically connected to the other end of the discharge coils 3 via a second coaxial transmission line 17. The matched network 4 is used for adjusting the impedance characteristic of the discharge coils 3 so that the adsorption of the radio-frequency power by the plasma is maximized.

One end of the tube 1 is connected to a first cover plate 6 in a sealed manner. The sealing structure is preferably a loose nut or a loose flange. The first cover plate 6 is connected with a positive ion extraction gate via an insulating medium 7 (the insulating medium is preferably made of ceramic). The positive ion extraction gate includes a first positive ion extraction gate 12 and a second positive ion extraction gate 13 which are successively arranged from inside out. The first positive ion extraction gate 12 and the second positive ion extraction gate 13 are each electrically connected to a negative pole of a DC power supply 8, and a positive pole of the DC power supply 8 to which the first positive ion extraction gate 12 and the second positive ion extraction gate 13 are electrically connected is grounded. The DC power supply 8 is used for providing a negative voltage to the first positive ion extraction gate 12 and the second positive ion extraction gate 13, a negative voltage at the second positive ion extraction gate 13 is higher than a negative voltage at the first positive ion extraction gate 12.

One end of the tube 1 is connected to a second cover plate 9 in a sealed manner. The sealing structure is preferably a loose nut or a loose flange. A flange joint 18 for connecting a vacuometer, a detection system or a test system is provided on the second cover plate 9. The second cover plate 9 is connected to a third cover plate 11 in a sealed manner via a sidewall 10, the second cover plate 9, the sidewall 10 and the third cover plate 11 are preferably connected by welding, and the third cover plate 11 is connected with a negative ion extraction gate via an insulating medium 7. The negative ion extraction gate includes a first negative ion extraction gate 14 and a second negative ion extraction gate 15 which are successively arranged from inside out, and the first negative ion extraction gate 14 and the second negative ion extraction gate 15 are each electrically connected to a positive pole of a DC power supply 8. A negative pole of the DC power supply 8 to which the first negative ion extraction gate 14 and the second negative ion extraction gate 15 are electrically connected is grounded. The DC power supply 8 is used for providing a positive voltage to the first negative ion extraction gate 14 and the second negative ion extraction gate 15, a positive voltage at the second negative ion extraction gate 15 is higher than a positive voltage at the first negative ion extraction gate 14.

The first cover plate 6, the second cover plate 9, the third cover plate 11 and the sidewall 10 are preferably made of metal, for example, stainless steel.

The positive and negative ion source based on radio-frequency inductively coupled discharge in this embodiment further includes a support platform 20 and a support frame 21. The support platform 20 is arranged horizontally and the support frame 21 is arranged vertically. The support platform 20 supports the insulating medium 7 and the sidewall 10 via the support frame 21 so that the tube 1 is kept in the horizontal state.

The positive ion extraction gate, the first cover plate 6, the tube 1, the second cover plate 9, the sidewall 10, the third cover plate 11, the negative ion extraction gate and the insulating medium 7 form a vacuum chamber in this embodiment. The first cover plate 6 and the third cover plate 11 should be each communicated with a vacuum system when operating.

The operating process of this embodiment is as follows.

1) the vacuum chamber is vacuumized so that the pressure inside it is not higher than $10^4$ Pa;

2) a proper amount of a working gas (for example, Ar, $N_2$, $O_2$, $CF_4$, $H_2$, $D_2$, $SF_6$, etc.) is fed from the intake pipe 2, and the vacuum systems on the two sides are started so that the pressure inside the vacuum chamber can be kept dynamically balanced from 0.1 Pa to 100 Pa and can be kept unchanged;

3) the radio-frequency power supply 5 outputs a radio-frequency power which may be a radio-frequency power from 0 W to 1000 W at 13.56 MHz; the radio-frequency power is input to the discharge coils 3 via the matched network 4; and the radio-frequency power generates an electromagnetic field by the discharge coils 3, and the electromagnetic field ionizes the working gas in the tube 1 to generate the plasma; and 4) After the generation of the plasma, a negative DC voltage is applied to the positive ion extraction gate to extract positive ion beams; and a positive DC voltage is applied to the negative ion extraction gate to extract the electrons or negative ion beams (corresponding negative ions can be generated and extracted only when the working gas is an electronegative gas, for example, $O_2$, $H_2$, $D_2$, $CF_4$, $SF_6$, etc.).

In this embodiment, the positive ions and the electrons and negative ions are extracted from two sides of the tube 1, respectively; the backplane is omitted, so that the problems of sputtering and overheating of the backplane during the extraction of pure positive ions and pure negative ions are solved, and meanwhile, the ion source constituted by the positive ions and the electrons and negative ions will not be contaminated by the sputtering, so that the ion source becomes more "clean".

The principle and implementations of the present invention have been described by specific examples herein. The description of embodiments is merely used for helping the understanding of the method of the present invention and its key concepts. Meanwhile, for a person of ordinary skill in the art, changes may be made to the specific implementations and application ranges according to the concepts of the present invention. In conclusion, the contents of the description shall not be regarded as limitations to the present invention.

What is claimed is:

1. A positive and negative ion source based on radio-frequency inductively coupled discharge, comprising a tube, a middle portion of which is communicated with an intake pipe; and discharge coils electrically connected to a matched network and a radio-frequency power supply successively are wound on the tube;

one end of the tube is connected to a first cover plate in a sealed manner, and the first cover plate is connected with a positive ion extraction gate via an insulating medium; and the positive ion extraction gate is electrically connected to a negative pole of a DC power supply; and the other end of the tube is connected to a second cover plate in a sealed manner, the second cover plate is connected to a third cover plate in a sealed manner via a sidewall, and the third cover plate is connected with a negative ion extraction gate via an insulating medium; and the negative ion extraction gate is electrically connected to a positive pole of the DC power supply;

wherein the end of the tube and the other end of the tube are opposite ends of the tube, and the first cover plate and the second cover plate are arranged on two end faces of the tube which are opposite to each other.

2. The positive and negative ion source based on radio-frequency inductively coupled discharge according to claim 1, characterized in that the positive ion extraction gate comprises a first positive ion extraction gate and a second positive ion extraction gate which are successively arranged from inside out, the first positive ion extraction gate and the second positive ion extraction gate are each electrically connected to a negative pole of a DC power supply, and a negative voltage at the second positive ion extraction gate is higher than a negative voltage at the first positive ion extraction gate.

3. The positive and negative ion source based on radio-frequency inductively coupled discharge according to claim 2, characterized in that a positive pole of the DC power supply to which the first positive ion extraction gate and the second positive ion extraction gate are electrically connected is grounded.

4. The positive and negative ion source based on radio-frequency inductively coupled discharge according to claim 1, characterized in that the negative ion extraction gate comprises a first negative ion extraction gate and a second negative ion extraction gate which are successively arranged from inside out, the first negative ion extraction gate and the second negative ion extraction gate are each electrically connected to a positive pole of a DC power supply, and a positive voltage at the second negative ion extraction gate is higher than a positive voltage at the first negative ion extraction gate.

5. The positive and negative ion source based on radio-frequency inductively coupled discharge according to claim 4, characterized in that a negative pole of the DC power supply to which the first negative ion extraction gate and the second negative ion extraction gate are electrically connected is grounded.

6. The positive and negative ion source based on radio-frequency inductively coupled discharge according to claim 1, characterized in that the matched network is electrically connected to one end of the discharge coils via a first coaxial transmission line whose middle portion is grounded, and the matched network is electrically connected to the other end of the discharge coils via a second coaxial transmission line.

7. The positive and negative ion source based on radio-frequency inductively coupled discharge according to claim 1, characterized in that a flange joint for connecting a vacuometer and/or a detection system is provided on the second cover plate.

8. The positive and negative ion source based on radio-frequency inductively coupled discharge according to claim 1, characterized in that a shield, which is grounded, is sleeved on an outer side of the discharge coils.

9. The positive and negative ion source based on radio-frequency inductively coupled discharge according to claim 1, further comprising a support platform and a support frame, the support platform being connected to the insulating medium and the sidewall via the support frame.

10. The positive and negative ion source based on radio-frequency inductively coupled discharge according to claim 1, further comprising vacuum systems, the first cover plate and the third cover plate being each communicated with one vacuum system.

* * * * *